(12) United States Patent
Wikus et al.

(10) Patent No.: US 11,073,579 B1
(45) Date of Patent: Jul. 27, 2021

(54) MAGNETICALLY COMPENSATED NMR ROTOR

(71) Applicant: Bruker Switzerland AG, Fällanden (CH)

(72) Inventors: Patrick Wikus, Nürensdorf (CH); Daniel Guy Baumann, Fällanden (CH); Markus Mayer, Gossau (CH); Martin Woodtli, Mönchaltdorf (CH); Robert Schauwecker, Zurich (CH)

(*) Notice: Subject to any disclaimer, the term of this patent is extended or adjusted under 35 U.S.C. 154(b) by 0 days.

(21) Appl. No.: 17/220,448

(22) Filed: Apr. 1, 2021

(30) Foreign Application Priority Data

Apr. 3, 2020 (DE) .................... 10 2020 204 379.5

(51) Int. Cl.
*G01R 33/30* (2006.01)
*G01R 33/31* (2006.01)

(52) U.S. Cl.
CPC ............ *G01R 33/307* (2013.01); *G01R 33/31* (2013.01)

(58) Field of Classification Search
CPC ............................. G01R 33/307; G01R 33/31
See application file for complete search history.

(56) References Cited

U.S. PATENT DOCUMENTS

| | | | |
|---|---|---|---|
| 3,681,683 A | 8/1972 | Huber | |
| 4,275,350 A | 6/1981 | Hill et al. | |
| 4,806,868 A | 2/1989 | Schulke | |
| 5,517,856 A | 5/1996 | Hofmann et al. | |
| 6,686,740 B2 | 2/2004 | Tschirky et al. | |
| 6,741,079 B2 | 5/2004 | Hofmann et al. | |
| 7,656,158 B2 | 2/2010 | Fey et al. | |
| 9,500,726 B2 | 11/2016 | Baumann | |
| 9,903,923 B2 | 2/2018 | Schell et al. | |
| 10,256,131 B2 | 4/2019 | Kosakai et al. | |
| 2002/0063561 A1 | 5/2002 | Higgins et al. | |
| 2004/0178793 A1 | 9/2004 | Leung et al. | |
| 2009/0066333 A1 | 3/2009 | Tanaka | |
| 2012/0194194 A1 | 8/2012 | Norell | |

FOREIGN PATENT DOCUMENTS

| | | |
|---|---|---|
| DE | 102014201076 B3 | 3/2015 |
| JP | 2001235526 A | 8/2001 |
| JP | 2006029964 A | 2/2006 |
| JP | 2009103517 A | 5/2009 |
| JP | 6123952 A1 | 5/2017 |

*Primary Examiner* — Jay Patidar
(74) *Attorney, Agent, or Firm* — Benoit & Côté Inc.

(57) ABSTRACT

An NMR rotor comprises a receptacle for inserting a sample container into a homogeneous region of an NMR magnetic field with flux density B, the field vector of which in the homogeneous region extends in the vertical direction along a z-axis. The rotor passes through regions with inhomogeneous magnetic field components and a flux density gradient dB/dz when the sample container is introduced. The rotor includes at least two different materials, one with diamagnetic properties and another with non-diamagnetic properties. The different materials are arranged to be geometrically distributed in the rotor so that the magnetic force on the rotor under the effect of a product t of magnetic flux density B and flux density gradient dB/dz, the magnitude of which exceeds 1400 $T^2$/m, either acts in the same direction as the weight force of the rotor or is smaller in magnitude than the weight force of the rotor.

15 Claims, 5 Drawing Sheets

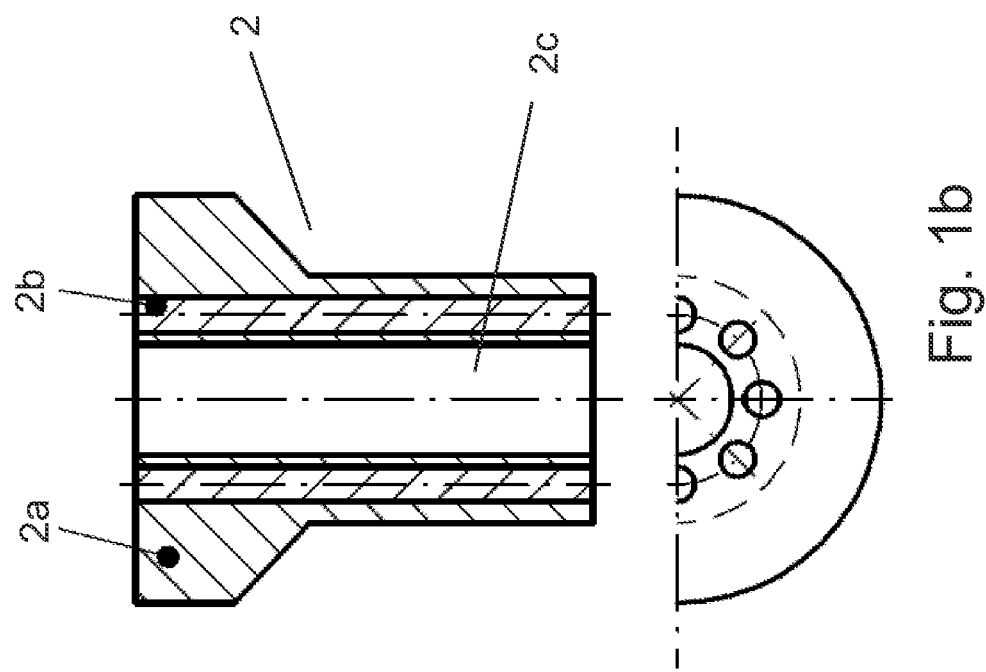
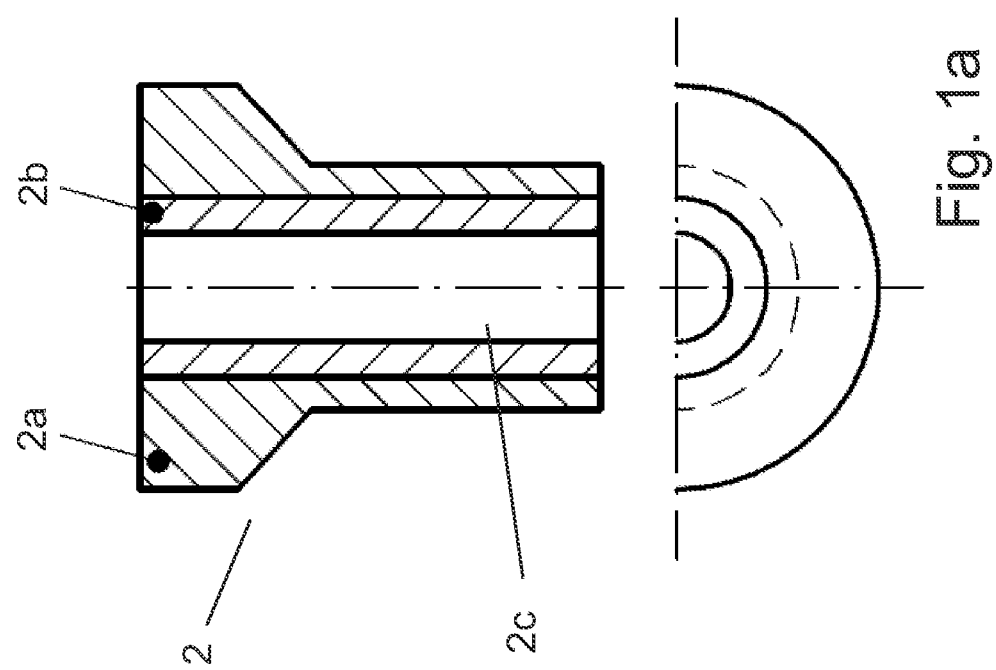

| Parameter | Length | Diameter | Wall thickness | Inner diameter | Density | Volume1 | Volume2 | Weight | Weight force |
|---|---|---|---|---|---|---|---|---|---|
| Unit | mm | mm | mm | mm | kg/m3 | mm3 | mm3 | g | N |
| Sample tube (Glass) | 200.0 | 2.950 | 0.295 | 2.360 | 2500.0 | 1367.0 | 874.9 | 1.23 | 0.012 |
| Sample volume (Water) | 40.0 | | | 2.360 | 997.0 | | 175.0 | 0.17 | 0.002 |
| Spinner (PCTFE) | 50.0 | 16.0 | 6.5 | 3.000 | 2130.0 | 10053.1 | 353.4 | 20.66 | 0.203 |

Fig. 5

MAGNETICALLY COMPENSATED NMR ROTOR

BACKGROUND OF THE INVENTION

Field of the Invention

The invention relates to an NMR rotor comprising a receptacle for inserting a sample container having a sample substance for NMR measurements in a homogeneous region of an NMR magnetic field with flux density B, the field vector of which in the homogeneous region extends in the vertical direction along a z-axis, the rotor passing through regions with inhomogeneous magnetic field components and at least one flux density gradient dB/dz when the sample container is introduced into the homogeneous region of the magnetic field.

Description of the Related Art

Such an NMR rotor, also referred to as a "spinner" in the prior art, is already known e.g., from U.S. Pat. No. 6,741,079 B2 and also from U.S. Pat. No. 5,517,856, in which different sample holders are also described, with a sample holder there comprising the rotor and the sample container.

The present invention generally relates to the field of nuclear magnetic resonance ("NMR"), in particular with NMR rotors for inserting a sample container having a sample substance for NMR measurements. NMR spectroscopy is a powerful method of instrumental analysis, in particular for analyzing sample compositions or for determining the structure of substances in samples.

The sample substance is typically poured in solid or liquid form into a substantially cylindrical sample tube. For measurement, it is brought into the measuring region of an NMR sampling head of an NMR apparatus. There, the sample substance is exposed to a strong, static magnetic field with flux density Bo, which is homogeneous in a z-direction, resulting in the alignment of nuclear spins in the sample substance. High-frequency electromagnetic pulses are then irradiated into the sample. This in turn produces high-frequency electromagnetic fields, which are detected in the NMR apparatus. Information regarding the properties of the sample can be obtained from the detected high-frequency fields. In particular, the chemical composition and the chemical bonding behaviors in the sample can be inferred from the position and intensity of NMR lines; see e.g., U.S. Pat. No. 9,500,726 B2.

A more or less "conventional" arrangement of an NMR measuring chamber, a rotor and a sample container is described in U.S. Pat. No. 6,686,740 B2, but here in combination with a "mounting sleeve". No special measures are taken to be able to insert samples into systems with high values of the product 13-dB/dz.

Similar devices with a rotor for NMR samples are described in U.S. Pat. Nos. 4,806,868, 4,275,350, JP 61023952 A, US 2004/0178793 A1 and U.S. Pat. No. 3,681,683. In this prior art, however, the focus is placed on the sample rotation and, in part, on the control thereof. For example, it describes how the rotor is supported on a gas cushion during rotation. Again, no special measures are taken in order to be able to insert samples into systems with high B·dB/dz.

JP 2001235526 A describes a device in which the NMR sample is introduced into the measurement volume using an "operation stick". Using such an "operation stick," no pneumatic inject/eject is required, and resistances (e.g., due to magnetic forces) can be easily overcome. However, such a device is very impractical for high-field magnets, where B·dB/dz is usually particularly large, since these magnets usually have a large spatial extension and the "operation stick" would have to be several meters long. This has a very negative effect e.g., on the ceiling height required at the installation site.

US 2002/063561 A1 describes a device for the axial transport of NMR samples, with the aid of which NMR samples can be transferred into the measurement volume of an NMR spectrometer. With this device, too, resistances (e.g., due to magnetic forces) can be overcome. The disadvantage of the device described in this reference is that it is complex and—due to the use of moving parts—also prone to errors and less reliable than a purely pneumatic solution. In addition, parts of the transport device come close to the measurement volume, which negatively affects the quality of the magnetic field prevailing there (especially its homogeneity). A particular ceiling height at the installation site is also required for installing and removing the transport device.

JP 2006029964 A proposes applying a material directly into the substance to be examined or onto the surface of the sample tube, the magnetic properties of which material (diamagnetism, paramagnetism, ferromagnetism) can be influenced in order to shorten the NMR relaxation time of the substance to be examined (typically fullerenes or carbon nanotubes). Here, the properties of the unit consisting of the sample tube and the sample substance are thus changed in a targeted manner, but not with special consideration of the B*dB/dz profile along the magnetic field axis z. In addition, the material having the special magnetic properties according to this reference is applied to the tube or mixed into the substance to be examined and is therefore not integrated in the NMR rotor as such.

U.S. Pat. No. 7,656,158 B2 describes a device in which the container of the NMR substance to be examined (e.g., the sample tube) is coated with a material having a special magnetic susceptibility in order to keep field disturbances inside the container (taking into account the magnetic susceptibility of the sample substance itself and the environment) small. However, this is not done with special consideration of the size of the B*dB/dz profile along the magnetic field axis z. In addition, the material having the special magnetic properties according to this prior art is applied to the tube and is therefore again not integrated in the NMR rotor as such.

Similarly to U.S. Pat. No. 7,656,158 B2, US 2009/0066333 A1 also pays attention to the magnetic susceptibility when selecting the material—in particular when selecting the material for the caps which axially limit the substance to be examined in the sample tube. Here, however, the focus is again on the homogeneity of the magnetic field at the location of the substance to be examined, and not on the forces that act when an NMR rotor with a sample container and sample substance is introduced into the measuring region. The B*dB/dz profile along the magnetic field axis is not taken into account. In addition, the material having the special magnetic properties is again not integrated in the NMR rotor as such.

A high quality of the NMR measurement depends, among other things, on the NMR sample being effectively temperature-controlled (high temperature stability over time, no temperature gradients in the sample substance), on the sample being still and without translational movement relative to the magnetic field and/or the RF coils located in the magnetic center during the NMR experiment, and on the sample being rotatable (at typically 20-50 Hz) in the magnetic center to average out off-axis gradients and, in the process, said sample moving extremely smoothly and not striking anything.

This problem is usually solved by pouring the sample substance into a glass tube. A typical NMR measuring tube is described in US 2012/0194194 A1. The glass tube is then sealed, either with a stopper or by hot-melting the open end. The glass tube is then clamped in a rotatable NMR rotor, e.g., made of a plastics material such as POM, PEEK, PCTFE or of ceramic material. This unit consisting of the NMR rotor and the sample tube can be moved up and down pneumatically—i.e., by a gas flow—in the magnetic bore of an NMR apparatus. The gas flow ("lift") is usually directed from below onto the unit consisting of the NMR rotor and the sample tube, so that the buoyancy generated by the gas flow can counteract the weight of the unit. In this way, the sample can be slowly introduced into the magnet center and ejected again after the measurement.

If the sample is in the magnetic center of the NMR apparatus, the NMR rotor makes contact with a "turbine". The NMR rotor—and thus also the sample tube having the sample substance—can be rotated via a plurality of tangential gas channels in the turbine and via a separate source to which a gas flow can be supplied. This helps to average out any off-axis gradients in the magnetic field and, even if they are present, to achieve narrow lines in the NMR spectrum. Optical markings for measuring the speed by means of a glass fiber are also attached to the NMR rotor.

As already mentioned above, effective temperature control of the sample is also important for a high-quality NMR measurement. It is necessary that the temperature of the sample remains as constant as possible over the entire duration of the NMR experiment in order to avoid "wandering" of the lines in the spectrum, and that said temperature is as close as possible to a desired target value in order to make different spectra comparable with one another. In addition, the temperature must be as constant as possible over the spatial extent of the sample substance in order to avoid line broadening and convection in the sample substance.

The diameter of the NMR tube is usually 10 mm and the level of filling with the sample substance is typically between 20 mm and 80 mm. The temperature control of the sample is conventionally ensured by means of a third gas flow, which is preheated to the desired temperature and then sweeps along the outside of the sample tube from below. Disturbance variables in the temperature control are, for example, the dissipation of power in the sample substance itself, e.g., via the RF pulses, dissipation in the electrical shim coils or heat dissipation into the heat sink formed by cooled RF coils in the sampling head.

The turbine—and therefore also the NMR rotor—is located above the magnetic center, typically between 30 mm and 200 mm away. The NMR rotor is therefore usually no longer in the homogeneous "plateau" of the magnetic field, but in a region in which the magnetic field already has an axial gradient.

During operation, multiple forces act on the unit consisting of the sample tube and the NMR rotor:

The weight of the unit consisting of the sample and the NMR rotor, which creates a downward force Frictional forces that act between the NMR rotor and the bore wall or between the NMR rotor and the turbine. These frictional forces must be taken into account especially if the gap between the NMR rotor and the bore is selected to be very small.

Buoyancy generated by the lift gas flow. When the sample is removed, the lift gas flow is selected to be so great that the buoyancy leads to an upward movement of the sample, i.e., overcomes weight force, frictional force and other forces. When the sample is introduced, the lift gas flow is selected so that the sensitive sample slowly slides into the magnet center and gently touches the turbine.

Buoyancy caused by the temperature-control gas. The temperature-control gas flow must be selected to be so great that the temperature gradient that occurs in the sample is smaller than the permissible maximum value (for high-resolution measurements this is in the order of magnitude of 1 mK). Which temperature-control gas flow is required for this depends on the specific heat capacity of the temperature-control gas and the size of the thermal sources of interference. Typical temperature-control gas flows are between 400 l/h and 1000 l/h.

Under no circumstances should the lift gas flow become negative. This would be possible e.g., using a pump that "sucks the sample down". However, this would be disadvantageous in that there would then be negative pressure in the bore and contaminants (e.g., dust) would get into the most sensitive part of the NMR spectrometer.

The lift gas flow is switched off during the NMR measurement.

The temperature-control gas cannot be switched off under any circumstances during the NMR measurement, as otherwise the quality of the measurement would suffer considerably. While the sample is being introduced and removed, the temperature-control gas flow can theoretically be switched off. However, this is not recommended as it will change the temperature of some components in the bore. When the next NMR measurement is started, these components must first regain their thermal equilibrium, which can take a long time. This reduces the time in which the spectrometer can be used. It is therefore advantageous to leave the temperature-control gas flow switched on even in the periods in which no experiment is running.

It is also advantageous to let the temperature-control gas flow from bottom to top in the vertical direction, since convection within the gas flow can be minimized in this way.

For NMR measurements on liquid samples—at least during shimming, but occasionally also during the experiment itself—the sample tube having the liquid to be examined is rotated about the z-axis. Typical speeds are between 20 and 50 revolutions per second. The sample tube is rotated together with the NMR rotor, in which it is firmly clamped. This rotation for determining off-axis gradients should not be confused with the often used, much faster rotation of solid samples about the so-called "magic angle", which takes place at a speed of several kHz.

Various forces result from the interaction of the unit consisting of the NMR rotor and the sample tube with the magnetic field. Particularly noteworthy are:

Forces created by eddy currents. If a sample is introduced into the magnet center or ejected from the magnet center, eddy currents can form in the NMR rotor if there are closed, electrically conductive current paths. These then act like an "eddy current brake".

Forces that result from interactions between the material of the sample tube, the NMR rotor and the sample substance itself. Ferromagnetic materials are usually not used in larger quantities or concentrations in the production of NMR rotors or sample tubes, since the interaction with the very large magnetic fields that typically prevail in NMR magnets would be much too great.

Instead, materials are usually used which are colloquially referred to as "non-magnetic," but which, strictly speaking, are diamagnetic or paramagnetic. Diamagnetic, paramagnetic, ferromagnetic and ferrimagnetic materials with magnetization M and volume V experience a force in an inhomogeneous magnetic field with flux density B of $$F=(M*V)\nabla B.$$

Non-diamagnetic materials are pulled in the direction in which a higher magnetic field prevails and diamagnetic materials are pulled in the direction in which a lower magnetic field prevails. The magnetization M of the material depends on the applied flux density B and on the magnetic susceptibility x.

$$M=(\chi/\mu_0)B$$

In diamagnetic materials, the magnetization is opposite to the applied field, and the following applies for the magnetic susceptibility: $-1<\chi<0$, typically $\chi=-10^{-9} \ldots -10^{-6}$. Examples of diamagnetic materials are $H_2O$ and Cu. For non-diamagnetic materials, $\chi>0$, typically $\chi=10^{-6} \ldots 10^{-2}$ for paramagnetic materials. Examples of paramagnetic materials are $O_2$, Al or Pt.

NMR rotors are typically made from materials such as POM or PEEK, which are diamagnetic. High-field NMR often works with aqueous sample substances that are also diamagnetic.

For comparison, $\chi=10^{+2} \ldots 10^{+5}$ applies for ferromagnetic materials; the interaction with the magnetic field is therefore many times greater than with diamagnetic or paramagnetic materials, which is why ferromagnetic materials are usually not used for building NMR rotors.

The two formulas given above show that the force acting on the unit consisting of the NMR rotor, the sample tube and the sample substance depends on the respective material properties and on the product B·∇B.

The conventional solution described above is disadvantageous in that for new types of magnets—especially ultrahigh-field magnets in which insert coils with extremely high current densities (for example made of HTS materials) are used in the magnet—the product of the magnetic field with flux density B and field gradient dB/dz (i.e., B*dB/dz) can reach very high values along the z-axis within the bore due to the design. This occurs in particular in the edge region of the insert coils. The combined image in FIG. 3 shows, by way of example, the curves of B*dB/dz for a typical high-field magnet<1.1 GHz and for a typical ultrahigh-field magnet>1.1 GHz along the z-axis.

The result of the high values for B·dB/dz is that the force resulting from the magnetic properties of the NMR rotor becomes significant. It is technically practically impossible to define the material of the NMR rotor in such a way that it is magnetically perfectly neutral (so to speak "non-magnetic") under the influence of high magnetic fields and field gradients.

Specifically, this means that, in extreme cases, diamagnetic NMR rotors cannot be introduced into the magnetic center of the NMR spectrometer at all, and non-diamagnetic NMR rotors cannot be ejected from the magnetic center without a very large lift gas flow. The dead weight of a diamagnetic NMR rotor is no longer sufficient to ensure that the NMR rotor is pressed down sufficiently so that it does not lift off under the influence of the temperature-control gas. Non-diamagnetic NMR rotors are pressed firmly in the direction of the magnet center, and so the lift gas flow required for ejection ("eject") could become too great in extreme cases, or—which is much more often the case—the frictional forces between the NMR rotor and the turbine become too great when the sample rotates, and among other things lead to heating.

In the operating state, it is advantageous if the magnetic forces do not counteract the weight of the NMR rotor so strongly that it begins to lift under the influence of the temperature-control gas. Otherwise, this leads to vibrations (the NMR rotor lifts from its rest position under the influence of the gas, allowing more gas to flow through below the NMR rotor, the pressure drops, and the NMR rotor drops again), which are extremely detrimental to the quality of the NMR measurement. In extreme cases, the magnetic forces can counteract the weight of the NMR rotor so strongly that the position of the rotor (and thus also of the NMR measurement sample) is no longer sufficiently well defined.

Furthermore, it is advantageous in the operating state if the NMR rotor is centered radially by magnetic forces (restoring force in the case of slight radial eccentricity). In conventional arrangements (diamagnetic NMR rotor in magnets<1.1 GHz) this requirement is typically fulfilled because the criterion B·dB/dr>0 is met at the location of the NMR rotor. In magnets>1.1 GHz, on the other hand, there may be a region with the opposite sign of B·dB/dr, where a predominantly non-diamagnetic NMR rotor would thus be advantageous. Apart from the sign of B·dB/dr at the location of the NMR rotor and the ratio of the diamagnetic to non-diamagnetic volume fraction and the susceptibilities of the materials present, the resulting radial force on the NMR rotor also depends on the radial distribution of the materials in the NMR Rotor. The typical curve of B·dB/dr along the z-axis with a fixed radius r=10 mm is shown by way of example in FIG. 4. With ultrahigh-field magnets B·dB/dr can assume negative values.

SUMMARY OF THE INVENTION

The present invention provides an improved NMR rotor of the type described at the outset while avoiding the above-discussed disadvantages of known, generic arrangements. In particular, the present invention makes NMR measurements on NMR samples easier to carry out in the case of particularly strong magnetic fields, with the quality of the NMR measurement being as high as possible and the handling of the NMR sample, in particular its introduction into the homogeneous region of the magnetic field, being as simple as possible.

This is achieved by the present invention in an equally surprisingly simple and inexpensive, but very effective manner in that the NMR rotor is composed of at least two different materials, of which one material has diamagnetic properties and another material has non-diamagnetic properties, and in that the different materials are arranged so as to be geometrically distributed in or on the NMR rotor in such a way that the magnetic force on the NMR rotor under the effect of a product $\phi_z$ of magnetic flux density B and flux density gradient dB/dz, the magnitude of which exceeds the value of 1400 $T^2/m$, either acts in the same direction as the weight force of the NMR rotor or is smaller in magnitude than the weight force of the NMR rotor.

The magnetic force $F_{mag,z}$ which acts on the NMR rotor according to the invention in the inhomogeneous region of the NMR magnetic field satisfies the following relationship:

$$F_{mag,z} = \frac{1}{\mu_0} \cdot \int_{V_{Rotor}} \chi \cdot B \cdot \frac{dB(z)}{dz} \cdot dV$$

where χ and B are location-dependent. The susceptibilities χ vary from material to material.

The geometric distribution of the materials in or on the NMR rotor according to the invention should be designed in such a way that it has magnetic properties which, in the NMR measurement mode under the influence of the NMR magnetic field with flux density B and its inhomogeneous components dB/dz, ensure that the resulting magnetic force on the unit is between 0.02 N and 0.2 N, preferably more than 0.05 N. Taking into account gas-dynamic forces that can act on the NMR rotor during operation due to a fluid turbine, it will be necessary in some applications to compensate for a total force of more than 0.2 N acting on the rotor.

Preferably, the type of different materials is selected and the materials are arranged in or on the rotor in such a way that, under the influence of the NMR magnetic field with flux density B and its inhomogeneous components dB/dz, no mechanical moments and no imbalance occur during rotation in the NMR measurement mode on the unit consisting of the rotor, sample container and sample substance. In addition, the NMR rotor should be designed in such a way that it is radially self-centering in an NMR magnet with a given curve of the NMR magnetic field B and its inhomogeneous components dB/dz under the influence of the magnetic field during operation and with rotation of the rotor.

As mentioned, the NMR rotor is made from at least two different materials, one of which has diamagnetic properties and the other non-diamagnetic properties, i.e., normally paramagnetic, ferromagnetic or ferrimagnetic properties. In particular, this also considerably simplifies the handling of the NMR sample, in particular its introduction into the homogeneous region of the magnetic field.

When the NMR rotor is introduced into or ejected out of the NMR magnet, the rotor travels through the entire magnet bore or at least almost its entire length. The NMR rotor according to the invention should therefore be designed for all ranges of magnetic forces applied in each case.

The requirement that the magnetic force on the NMR rotor under the effect of a product $\phi_z$ of magnetic flux density B and flux density gradient dB/dz, the magnitude of which exceeds the value of 1400 T²/m, either acts in the same direction as the weight force of the NMR rotor or is smaller in magnitude than the weight force of the NMR rotor, ensures that the NMR rotor also safely enters the homogeneous region of the magnetic field and does not "get stuck" outside the homogeneous region when it is introduced.

As a rule, the ejection of an NMR rotor together with the sample container and the sample substance in an NMR system is carried out by means of compressed air blown in from below. It is assumed that the magnet of the NMR spectrometer in which the NMR rotor according to the invention is to be used has a vertical bore in which the bore axis extends substantially in parallel with the vertical gravitational vector.

A "brute force" approach—i.e., with sufficiently high pressure or a sufficiently high gas flow rate—would probably then result in a rotor that is not optimally designed coming back out of the bore, which rotor is pulled by the magnet in the direction of the magnet center.

However, this is intended to be avoided as far as possible by suitable dimensioning of the different magnetic materials of the NMR rotor according to the invention, in that the NMR rotor is designed in such a way that the magnetic force on the NMR rotor is preferably less than 50% of the weight force of the NMR rotor.

Very particularly preferred is a class of embodiments of the NMR rotor according to the invention in which the product φz is given by $$\Phi_z = \frac{1}{V_{Rotor}} \cdot \int_{V_{Rotor}} B \cdot \frac{dB(z)}{dz} \cdot dV$$

where $|\phi_z|>1400$ T²/m, preferably $|\phi_z|>1500$ T²/m, particularly preferably $|\phi_z|>2000$ T²/m, and where $V_{Rotor}$ represents the volume of the NMR rotor and dV represents an infinitesimal volume element of the NMR rotor.

NMR rotors that are compatible with such high values of $\phi_z$ are suitable for use in the most powerful and modern class of NMR magnets, which are distinguished due to the high flux density prevailing in their center of more than 23 T, sometimes more than 25 T, and occasionally even more than 28 T. These high flux densities make it possible to have NMR measurements with a particularly high resolution and a particularly high signal-to-noise ratio. For practical reasons (laboratory size, transport), these highly powerful magnets must also be as compact as possible. This in turn leads to steep (large) field gradients dB/dz along the bore, which also contributes to a large product φz. Due to the compatibility with such high values of φz, the NMR rotors described here allow measurements in this class of NMR magnets.

A particularly advantageous further class of embodiments of the NMR rotor designed according to the invention is characterized in that at least one non-diamagnetic material of the NMR rotor, preferably all the non-diamagnetic materials, have paramagnetic properties.

Paramagnetic materials—since they are pulled in the direction of the higher magnetic field in inhomogeneous fields—are ideally suited to balance the force which is in the direction of the lower magnetic field and acts on a diamagnetic base material.

Ferromagnetic and ferrimagnetic materials are also pulled in the direction of the higher field in inhomogeneous fields, but their susceptibilities with $\chi=10^{+2} \ldots 10^{+5}$ are so high that—due to mechanical production tolerances and inaccuracies in determining the quantity—it would be significantly more difficult to achieve exact compensation of a diamagnetic material. Paramagnetic materials typically have a magnetic susceptibility of $\chi=10^{-6} \ldots 10^{-2}$, i.e., four to eleven orders of magnitude smaller than that of ferromagnetic or ferrimagnetic materials. A desired force effect can therefore be set much more precisely than with ferromagnetic or ferrimagnetic materials.

In preferred developments of this further class of embodiments, at least one diamagnetic and at least one non-diamagnetic material are arranged in or on the NMR rotor in such a way that the following applies in the NMR magnetic field with flux density B of a high-field NMR magnet at the location of the NMR rotor:

$$\chi_{dia} \cdot \int_{V_{dia}} \frac{dB}{dr} \cdot dV + \chi_{non-dia} \cdot \int_{V_{non-dia}} \frac{dB}{dr} \cdot dV < 0$$

where $\varphi_{dia}$ represents the magnetic susceptibility of the diamagnetic material, $X_{non-dia}$ represents the magnetic susceptibility of the non-diamagnetic material, $V_{dia}$ represents the volume of the diamagnetic material in the NMR rotor, $V_{non-dia}$ represents the volume of the non-diamagnetic material in the NMR rotor, dB/dr represents the gradient of the flux density of the NMR magnetic field in the volume of the rotor in the radial direction with respect to the z-axis and dV represents an infinitesimal volume element of the NMR rotor.

Such an NMR rotor has the advantage that it centers itself in the inhomogeneous field of a high-field magnet, which can have negative gradients B·dB/dr in the radial direction due to the extremely high current density in the insert coils. This self-centering helps to ensure that the sample container having the sample substance to be examined reaches the central region virtually by itself, in which region the magnetic field is most homogeneous and most suitable for a high-quality NMR measurement. If the NMR rotor is rotated about the z-axis to determine off-axis gradients in the region of the sample container, the magnetic self-centering helps to ensure almost perfect concentricity.

Further advantageous embodiments of the invention are those in which at least one of the materials of the NMR rotor, in particular the paramagnetic material, if it is electrically conductive, is arranged in the NMR rotor in such a way that it does not completely enclose the receptacle. This is intended to prevent circular currents in particular.

When the NMR rotor is introduced into or removed from the homogeneous region of the magnetic field, circular currents would otherwise develop in the electrically conductive material, causing the rotor to heat up. This heating can be so strong that the temperature of the sample substance to be measured increases. In the case of sensitive substances—e.g., biological samples—this can even lead to the destruction of the substance.

In addition, the circular currents—via their interaction with the magnetic field—act like an eddy current brake, i.e., the rotor seems to resist the desired direction of movement (typically downward for the inject, and upward for the eject). This can mean that the inject, if it is only driven by gravity, proceeds very slowly, and high gas flows and/or pressures are required for the eject.

Further advantageous embodiments of the invention are characterized in that the NMR rotor comprises a rotor axis in the center of the receptacle, which axis is oriented along the z-axis when the sample container is introduced into the homogeneous region of the magnetic field, in that the NMR rotor is constructed mirror-symmetrically with respect to a plane of symmetry containing the rotor axis and/or rotationally symmetrically with respect to the rotor axis, and in that the diamagnetic material and the non-diamagnetic material is distributed mirror-symmetrically and/or rotationally symmetrically about the rotor axis in the NMR rotor.

For example, the NMR rotor can comprise a receptacle that is cylindrical about the rotor axis. The cross sections of the rotor perpendicular to the cylinder axis will generally be circles, so that the receptacle has circular-cylindrical symmetry and is therefore particularly easy to produce. For special applications, however, other shapes of the cylinder cross sections are also conceivable, for example ellipses. In addition, the NMR rotor according to the invention could also have multiple symmetry, so that, for example, a corrugation is present at its outer edge for fluid propulsion of the rotation.

For some applications, sample containers are also used in which the liquid volume in which the substance to be examined is located during the measurement has a rectangular or elliptical cross section, for example. These sample containers—usually called "slotted tubes"—allow higher signal-to-noise ratios under special conditions. NMR rotors for such tubes could in some cases just be mirror symmetrical.

Mirror-symmetrical arrangements are also ideally suited for arranging electrically conductive materials in such a way that no circular currents can develop, while at the same time ensuring that the rotor does not have any imbalance that could impair the rotation about the z-axis.

In preferred developments of these embodiments that are particularly flexible in their individual design, one of the materials of the NMR rotor, preferably a non-diamagnetic material, particularly preferably a paramagnetic material, is in the form of at least two rod-shaped parts and is arranged in the base material of the NMR rotor in parallel bores extending in parallel with the rotor axis. The parallel bores and the rod-shaped parts should be distributed as symmetrically as possible around the rotor axis. Variants are also conceivable in which there are more bores than there are rod-shaped parts inserted into the rotor in the actual NMR experiment. For example, 12 bores could be provided and then only 6 could be loaded with a paramagnetic or non-diamagnetic material in individual cases. In this way, the magnetic properties of the rotor can be optimally adapted in a highly individual manner to the actual and possible also changing conditions on site.

The embodiment described above with rod-shaped compensation material is particularly easy and inexpensive to produce. This embodiment is also ideally suited for arranging electrically conductive materials in such a way that no circular currents can develop, while at the same time ensuring that the rotor does not have any imbalance that could impair the rotation about the z-axis.

Alternatively, in further advantageous developments, the non-diamagnetic and the diamagnetic material of the NMR rotor can be at least partially, preferably homogeneously, mixed, in particular particles in plastics materials, preferably paramagnetic particles in a diamagnetic plastics material. These variants of the invention can be produced particularly simply and cost-effectively—for example by conventional injection molding processes.

The advantage is that a large number of "compensation particles" can be evenly distributed easily and inexpensively. At the macroscopic level, the rotor material actually seems to be magnetically completely neutral and at the same time to have a homogeneous density, which is advantageous in terms of imbalance and magnetic properties.

In other alternative developments, the materials of the NMR rotor having different magnetic properties are at least partially applied in one or more layers. This production method is also technically easy to control and leads to very precise results.

Particularly preferred are also embodiments of the NMR rotor according to the invention in which the NMR rotor is predominantly composed of one of the at least two materials having different magnetic properties, preferably of a diamagnetic material. These embodiments will probably be the norm for normal laboratory applications.

The rotor is usually made from a base material, and then compensation material is incorporated or applied in one of the ways described above. It is also possible to retrofit conventional rotors for low-field magnets for use in ultra-high-field magnets, e.g., by introducing compensation rods into bores provided for this purpose or by applying compensation layers. Typical materials that are suitable for producing the main body are, as mentioned at the outset, POM, PEEK or PCTFE, i.e., diamagnetic materials.

In practice, developments of these embodiments in which the NMR rotor is composed of one of the at least two materials having different magnetic properties in a proportion between 90 and 95% by volume, preferably approximately 92.5% by volume, and is composed of the other material in a proportion of from 5 to 10% by volume, preferably approximately 7.5% by volume, prove to be particularly advantageous. It should be noted that the volume percentages depend on the susceptibility of the specific materials used. The values given above result from the susceptibilities of the most common dia- and paramagnetic materials. It is advantageous to select the susceptibilities in such a way that a quantity of each of the materials used must be installed that is large enough that quantity fluctuations resulting from manufacturing tolerances are small compared to their absolute quantity.

Particularly preferred is a class of embodiments of the invention in which the diamagnetic material comprises plastics material, for example POM, PEEK or PCTFE, and/or ceramic material such as glass ceramic material, in particular with mica embedded in a borosilicate matrix, or a machinable aluminum-nitride ceramic material. POM, PEEK or PCTFE are characterized by their good machinability, their mechanical properties and their resistance to many chemicals. Ceramic materials are in particular characterized by their high temperature resistance, which allows NMR measurements in the high temperature range.

In further preferred variants of the embodiments described above of the NMR rotor according to the invention, the non-diamagnetic, in particular the paramagnetic material, contains titanium, aluminum or platinum. These materials can be easily sourced in good quality and high purity. Semi-finished products are available in a variety of shapes, making production quick and inexpensive.

In addition or alternatively, in further embodiments of the NMR rotor designed according to the invention, the geometric distribution of the materials in or on the NMR rotor can be designed such that the magnetic force on the NMR rotor is between 0.02 N and 0.2 N, preferably at most 0.05 N.

These force limits have proven to be particularly effective in practical operation and lead to good results in a large number of practical experimental conditions (e.g. different temperature-control gas flows between 400 l/h and 1000 l/h, sample rotation between 5 and 50 Hz and in NMR magnets up to a 1H resonance frequency of 1.2 GHz) in which the rotor with the sample can be easily introduced into the homogeneous region of the magnetic field and ejected again, and also remains still and vibration-free on the turbine during the measurement.

The scope of the present invention also includes a method for the design and production of an NMR rotor apparatus according to the invention and of the kind described above, which is characterized in that first the magnetic susceptibility of a base material of the rotor, preferably the diamagnetic material, is determined, and in that subsequently a magnetic compensation of the NMR rotor by a further material having different magnetic properties, preferably paramagnetic material, is determined individually for each NMR rotor on the basis of the measurement result of the base material, in particular taking into account the special properties of the high-field NMR magnet used. A special NMR rotor is preferably produced for each class of sample substances, depending on their susceptibility and that of the solvent (usually aqueous solutions, acetone, etc.).

This process allows the magnetic properties to be matched almost perfectly to the prevailing conditions, thus allowing the best possible results to be obtained from an NMR ultrahigh-field spectrometer without excessive effort. Measured against the total costs of an NMR ultrahigh-field spectrometer, the method described above causes negligible additional costs, but makes a decisive contribution to the quality of the NMR measurement.

Further advantages of the invention can be found in the descriptions and the drawings. Likewise, the features according to the invention that are mentioned above and set out in the following can each be used individually per se or together in any desired combinations. The embodiments shown and described are not to be understood as an exhaustive list but instead are of an exemplary nature for describing the invention.

BRIEF DESCRIPTION OF THE DRAWINGS

The invention is illustrated in the drawings and is explained in more detail with reference to embodiments. In the drawings:

FIG. 1a is a schematic vertical sectional view of a first embodiment of the NMR rotor according to the invention with a casing part consisting of diamagnetic material and a cylindrical insert consisting of non-diamagnetic material, with a schematic half-section through a plane perpendicular to the axis being shown in the lower region of the figure;

FIG. 1b is similar to FIG. 1a, but with a second embodiment of the NMR rotor according to the invention, in which bores which extend in parallel with the axis and are intended for inserting rods consisting of non-diamagnetic material are provided in a casing part consisting of diamagnetic material;

FIG. 5 shows a table with specific numerical values for a typical embodiment of an NMR rotor.

DETAILED DESCRIPTION

Figure 2:
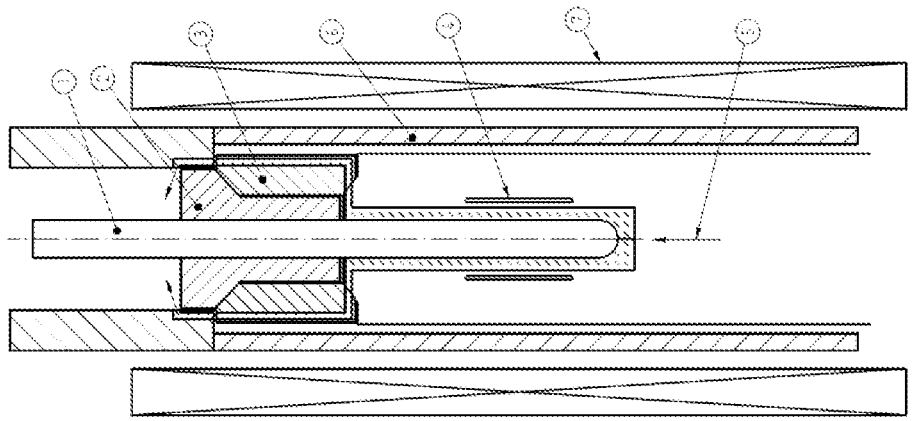
FIG. 2 is a schematic vertical section through a detail of an NMR spectrometer according to the prior art with an NMR sampling head carrying a sample holder with an NMR rotor and an inserted sample tube in the measuring position.

FIGS. 1a and 1b of the drawings each show, in schematic views, preferred embodiments of the NMR rotor according the invention, and how it can also be incorporated, with these modifications, in the prior art NMR spectrometer shown in detail in FIG. 2.

Such an NMR system, usually an NMR spectrometer, having an NMR magnet system 7 for generating a homogeneous static magnetic field with flux density B along a z-axis 5 comprises, in the measurement mode, a sampling head 6 that has an RF transmission and reception coil system 4 and an opening extending in the z-direction for receiving an NMR sample container 1 (usually in the form of a sample tube) which contains a sample substance to be examined by means of NMR measurement during operation. The NMR sample container 1 having the sample substance—not specifically shown in the drawings for the sake of clarity—is held by a sample container with an NMR rotor 2 ("spinner") and is introduced ("injected") into the NMR sampling head 6 together with a sample holder for the NMR measurement and is ejected ("ejected") together therewith again after the measurement. When the sample holder is introduced into the homogeneous region of the magnetic field, it passes through regions with inhomogeneous magnetic field components and at least one flux density gradient dB/dz. In the NMR measurement mode, the NMR rotor 2, which is usually rotatable, is supported on an NMR stator 3 ("turbine") or on an air flow generated by the NMR stator 3 or a compressed air device, with at least the part of the sample substance on which the NMR measurement is to be carried out being located in the homogeneous region of the magnetic field.

The NMR rotor 2 according to the invention is distinguished from the known NMR rotors according to the prior art in that it is composed of at least two different materials, of which one material has diamagnetic properties and another material has non-diamagnetic, preferably paramagnetic properties. According to the invention, the different materials are arranged so as to be geometrically distributed in or on the NMR rotor 2 in such a way that the magnetic force on the NMR rotor 2 under the effect of a product t of magnetic flux density B and flux density gradient dB/dz, the magnitude of which exceeds the value of 1400 $T^2$/m, either acts in the same direction as the weight force of the NMR rotor 2, or is smaller in magnitude than the weight force of the NMR rotor 2.

FIG. 1a shows an embodiment of the NMR rotor 2 according to the invention that is particularly easy to produce. Said rotor comprises a casing part 2a consisting of diamagnetic material and an insert 2b consisting of non-diamagnetic material, which insert is cylindrical in the present embodiment. In this embodiment, the insert 2b comprises the receptacle 2c for a sample container.

Another preferred embodiment of the NMR rotor 2 according to the invention is shown in FIG. 1b. Here, bores which extend in parallel with the rotor axis (and thus in parallel with the z-axis in the measurement mode) and are intended for inserting rod-shaped inserts 2b consisting of non-diamagnetic material are provided in a casing part 2a consisting of diamagnetic material. In this embodiment the non-diamagnetic material of the rod-shaped inserts 2b can also be electrically conductive, since this material is arranged in the NMR rotor 2 in such a way that it does not completely enclose the receptacle for the sample tube, and so no eddy current can flow in the plane perpendicular to the z-axis.

Figure 3:
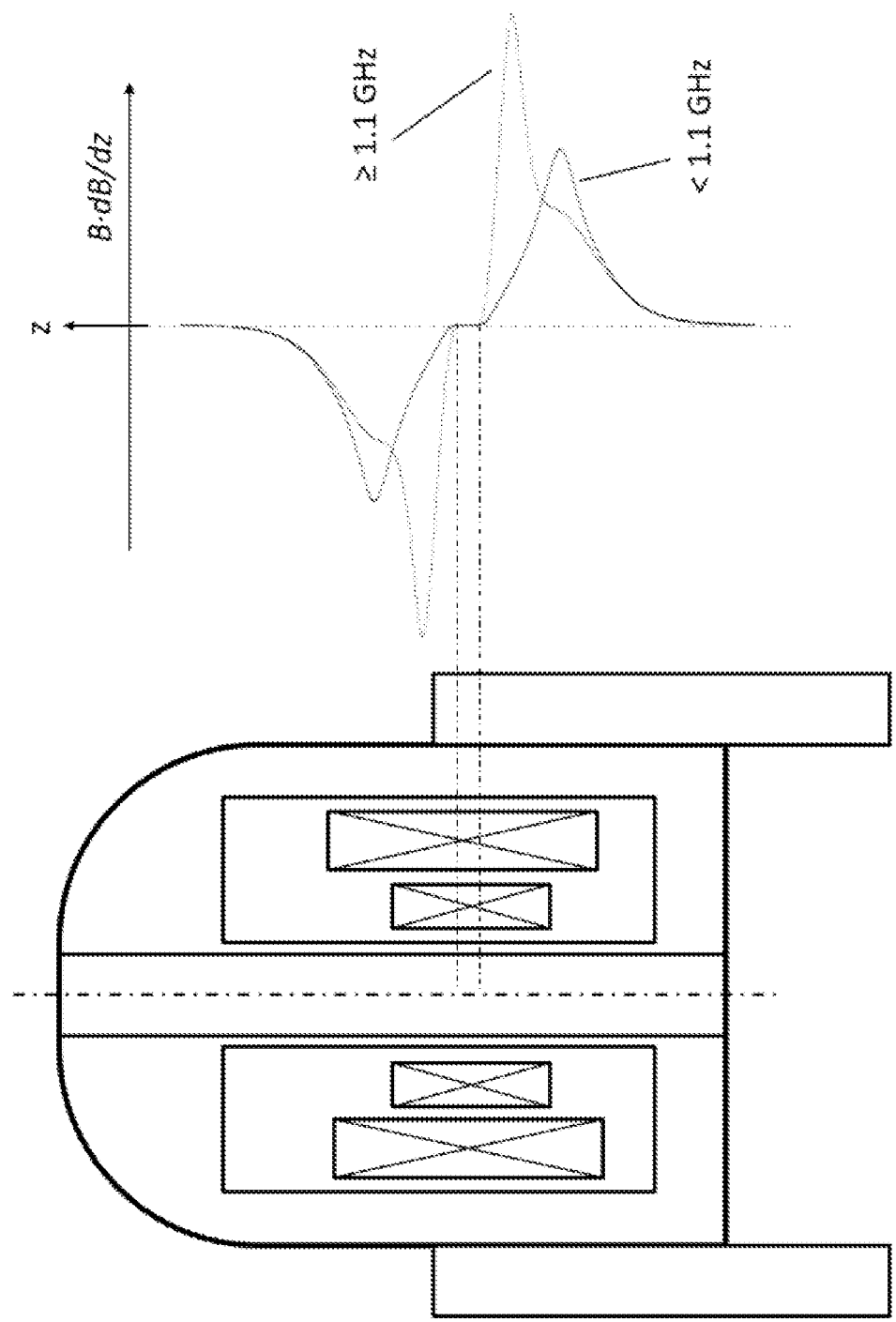
FIG. 3 is a schematic vertical section through an NMR spectrometer—for the sake of clarity without the sampling head—and, to the right, in the z-direction, shows the typical curve of the product $\phi_z$ of magnetic flux density B and flux density gradient dB/dz for a magnet system with a field strength<1.1 GHz (solid line) and for an ultrahigh-field magnet with a field strength≥1.1 GHz (dotted line)

FIG. 3 shows, on the left-hand side, a vertical section through an NMR spectrometer. On the right, the typical curve in the z-direction of the product t of magnetic flux density B and flux density gradient dB/dz is shown, namely for a magnet system with a field strength<1.1 GHz (solid line) and for an ultrahigh-field magnet with a field strength1.1 GHz (dotted line). Thus, the relevant $\phi_z$ value can be assigned to the relevant z-position in the spectrometer.

During the NMR measurement, the part of the sample substance to be measured is in the sample tube (not shown here for reasons of clarity) in a measurement volume of the NMR arrangement. This corresponds to the naturally relatively short z-section with the product $\phi_z$=B·dB/dz running flat on the z-axis, i.e., the homogeneous magnetic field region in which the NMR measurement takes place. Above (and of course below) the product $\phi_z$ has a curve with considerably higher values. Due to this inhomogeneous field region with, in some cases, very high magnetic forces acting on the NMR rotor, the sample holder having the measurement sample must be introduced before the measurement and ejected again after the measurement. Even during the actual measurement, the NMR rotor is at least partially in the inhomogeneous field region.

Figure 4:
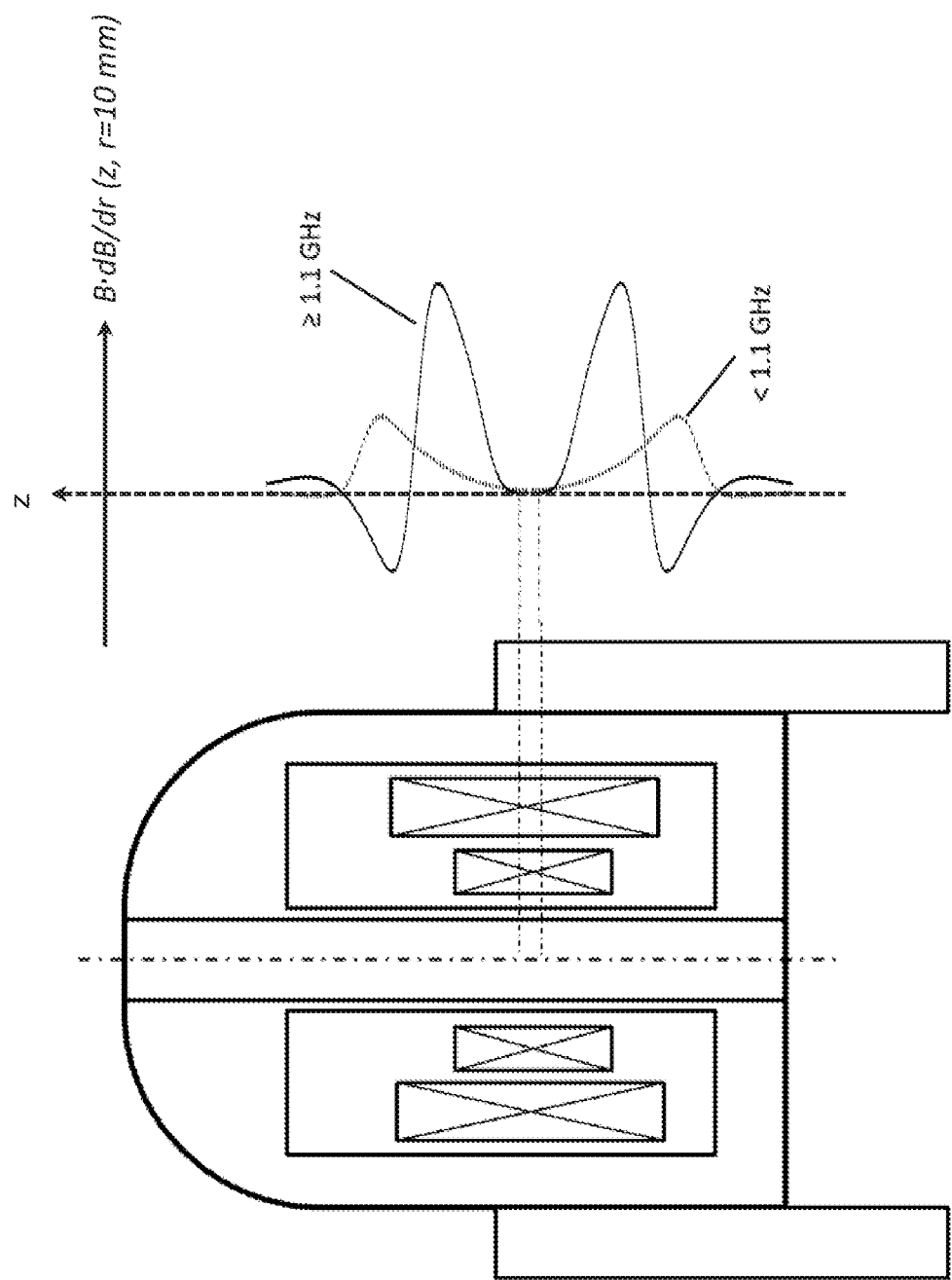
FIG. 4 shows a typical curve of the product $\phi_r$ of magnetic flux density B and flux density gradient dB/dr in the radial direction (perpendicular to the z-axis) with a radius r=10 mm for a magnet system with a field strength<1.1 GHz (dotted line) and for a ultrahigh-field magnet with a field strength≥1.1 GHz (solid line)

FIG. 4 shows, in the z-direction at a distance of 10 mm from the z-axis, a typical curve of the product $\phi_r$ of magnetic flux density B and flux density gradient dB/dr in the radial direction perpendicular to the z-axis for a magnet system with a field strength<1.1 GHz (dotted line) and for an ultrahigh-field magnet with a field strength≥1.1 GHz (solid line).

It can be seen that for magnets>1.1 GHz there may be a region with the opposite sign of B·dB/dr. If paramagnetic rotor material is used in this region, this material experiences a self-centering force. Apart from the sign of B·dB/dr at the location of the NMR rotor and the ratio of the diamagnetic to paramagnetic volume fraction and the susceptibilities of the materials present, the resulting radial force on the NMR rotor also depends on the radial distribution of the materials in the NMR rotor.

In the case of a layered structure of the NMR rotor according to the invention, the following specific numerical examples can be given for the layer thicknesses to be expected:

If it is assumed that the NMR rotor has a volume of 10 $cm^3$, this would roughly correspond to a cylinder having a length of 50 mm, an outer diameter of 16 mm, and a central bore (for the NMR sample tube) of 3 mm.

If 0.77 $cm^3$ of this were to consist of paramagnetic material, this would mean that the outermost 0.6 mm would have to consist of paramagnetic material. This would result in a diamagnetic cylinder with a 3 mm bore and an outside diameter of 15.4 mm. A layer with a thickness of 0.6 mm of paramagnetic material would then be applied (for example in an embodiment according to FIG. 1a).

If an embodiment with rods (for example according to FIG. 1b) is decided on and, for example, provides eight rods, each would have to have a volume of 0.09625 $cm^3$. With a rod length of 5 cm, this corresponds to a diameter of approximately 1.55 mm per rod.

What is significant for the NMR rotor according to the invention is the fact that, in a product $\phi$=B·dB/dz, said rotor experiences a magnetic force of which the magnitude, if directed against the weight force, is less than its weight force. The sample container and the sample substance can be neglected in this consideration.

The table in FIG. 5 shows typical numerical values of the weight force of a sample container (sample tube), a sample substance (water) and a spinner (here made of PCTFE). Volume1 and Volume2 are used to calculate the effective volume of the hollow cylindrical sample tube and spinner. It is clear from the calculation that the spinner makes the significant contribution to the weight force.

To a good approximation, the magnetic field gradient is constant over the volume of the NMR rotor. The requirement of the correct geometric arrangement arises from the fact that the product $\phi_z = B \cdot dB/dz$ nevertheless varies greatly and the two ends of the NMR rotor are each exposed to very different magnetic forces.

In practice, it is beneficial for the user if a plurality of different NMR rotors, for example with different distributions of diamagnetic and non-diamagnetic materials, are supplied (usually together with an NMR spectrometer). The user of the spectrometer can then select a particularly suitable NMR rotor for each sample substance (e.g., aqueous solution/non-aqueous solution).

The main element of the NMR rotor is preferably made of diamagnetic material. Depending on the specific measuring arrangement, a variety of different non-diamagnetic inserts, preferably in cylindrical form with corresponding outer diameters, can be individually and optimally selected to fit the receptacle bore in the diamagnetic "base spinner". In this way, fluctuations in the susceptibility of the base material can be ideally and individually balanced.

The features of all the above-described embodiments of the invention may also be combined with one another at least in most cases.

The invention claimed is:

1. An NMR rotor comprising:
a receptacle for introducing a sample container having a sample substance for NMR measurements into a homogeneous region of an NMR magnetic field with flux density B, a field vector of which, in the homogeneous region, extends in a vertical direction along a z-axis, the NMR rotor passing through regions with inhomogeneous magnetic field components and at least one flux density gradient dB/dz when the sample container is introduced into the homogeneous region of the magnetic field,
wherein the NMR rotor is composed of at least two different materials, of which one material has diamagnetic properties and another material has non-diamagnetic properties, and
wherein the different materials are arranged so as to be geometrically distributed in or on the NMR rotor in such a way that the magnetic force on the NMR rotor under the effect of a product $\phi_z$ of magnetic flux density B and flux density gradient dB/dz, the magnitude of which exceeds the value of 1400 T$^2$/m, either acts in the same direction as the weight force of the NMR rotor or is smaller in magnitude than the weight force of the NMR rotor.

2. The NMR rotor according to claim 1, wherein the product $\phi_z$ is given by $$\Phi_z = \frac{1}{V_{Rotor}} \cdot \int_{V_{Rotor}} B \cdot \frac{dB(z)}{dz} \cdot dV$$

where $|\phi_z| > 1400$ T$^2$/m, and where $V_{Rotor}$ represents the volume of the NMR rotor and dV represents an infinitesimal volume element of the NMR rotor.

3. The NMR rotor according to claim 1, wherein at least one non-diamagnetic material of the NMR rotor has paramagnetic properties.

4. The NMR rotor according to claim 1, wherein at least one diamagnetic and at least one non-diamagnetic material are arranged in or on the NMR rotor such that the following applies in the NMR magnetic field with flux density B of a high-field NMR magnet at a location of the NMR rotor:

$$\chi_{dia} \cdot \int_{V_{dia}} \frac{dB}{dr} \cdot dV + \chi_{non-dia} \cdot \int_{V_{non-dia}} \frac{dB}{dr} \cdot dV < 0$$

where:
$\chi_{dia}$ represents a magnetic susceptibility of the diamagnetic material,
$\chi_{non-dia}$ represents a magnetic susceptibility of the non-diamagnetic material,
$V_{dia}$ represents a volume of the diamagnetic material in the NMR rotor,
$V_{non-dia}$ represents a volume of the non-diamagnetic material in the NMR rotor,
dB/dr represents a gradient of the flux density of the NMR magnetic field in a volume of the rotor in a radial direction with respect to the z-axis and
dV represents an infinitesimal volume element of the NMR rotor.

5. The NMR rotor according to claim 1, wherein at least one of the materials of the NMR rotor is electrically conductive, and is arranged in the NMR rotor in such a way that it does not completely enclose the receptacle.

6. The NMR rotor according to claim 1, further comprising a rotor axis in the center of the receptacle, which axis is oriented along the z-axis when the sample container is introduced into the homogeneous region of the magnetic field, wherein the NMR rotor is constructed mirror-symmetrically with respect to a plane of symmetry containing the rotor axis and/or rotationally symmetrically with respect to the rotor axis, and wherein the diamagnetic material and the non-diamagnetic material is distributed mirror-symmetrically and/or rotationally symmetrically about the rotor axis in the NMR rotor.

7. The NMR rotor according to claim 6, wherein one of the materials of the NMR rotor is formed as at least two rod-shaped parts and is arranged in a base material of the NMR rotor in parallel bores extending in parallel with the rotor axis.

8. The NMR rotor according to claim 1, wherein the non-diamagnetic and the diamagnetic material of the NMR rotor are at least partially mixed.

9. The NMR rotor according to claim 1, wherein the materials of the NMR rotor having different magnetic properties are at least partially applied in one or more layers.

10. The NMR rotor according to claim 1, wherein the NMR rotor is predominantly composed of one of the at least two materials having different magnetic properties.

11. The NMR rotor according to claim 10, wherein the NMR rotor is composed of one of the at least two materials having different magnetic properties in a proportion between 90 and 95% by volume, and is composed of the other material in a proportion of from 5 to 10% by volume.

12. The NMR rotor according to claim 1, wherein the diamagnetic material contains plastics material and/or ceramic material.

13. The NMR rotor according to claim 1, wherein the non-diamagnetic material contains titanium, aluminum or platinum.

14. The NMR rotor according to claim 1, wherein a geometric distribution of the materials in or on the NMR rotor is configured such that a magnetic force on the NMR rotor is between 0.02 N and 0.2 N.

15. A method for the design and production of the NMR rotor according to claim 1, comprising:
determining a magnetic susceptibility of a base material of the NMR rotor;

determining a magnetic compensation of the rotor by a further material having different magnetic properties on the basis of the determined magnetic susceptibility of the base material; and arranging the geometrical distribution of the base material and the further material in the rotor so as to provide said magnetic force on the NMR rotor.

\* \* \* \* \*